(12) United States Patent
Kim et al.

(10) Patent No.: US 6,396,322 B1
(45) Date of Patent: May 28, 2002

(54) DELAY LOCKED LOOP OF A DDR SDRAM

(75) Inventors: Young-Hee Kim; Kie-Bong Ku, both of Kyoungki-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/867,812

(22) Filed: May 30, 2001

(30) Foreign Application Priority Data

May 31, 2000 (KR) ......................................... 2000-29691

(51) Int. Cl.$^7$ ................................................. H03L 7/06
(52) U.S. Cl. ......................................... 327/158; 327/161
(58) Field of Search .............................. 327/147, 149, 327/150, 152, 153, 156, 158, 159, 161

(56) References Cited

U.S. PATENT DOCUMENTS

| | | | | |
|---|---|---|---|---|
| 5,594,376 A | * | 1/1997 | McBride et al. | 327/149 |
| 5,715,217 A | * | 2/1998 | Fuji | 369/44.26 |
| 6,198,690 B1 | * | 3/2001 | Kato et al. | 365/233 |

* cited by examiner

*Primary Examiner*—Tuan T. Lam
(74) *Attorney, Agent, or Firm*—Marshall, Gerstein, & Borun.

(57) ABSTRACT

A delay locked loop is disclosed which is capable of operating at both of a rising edge and a falling edge of a clock. The delay locked loop includes: a first differential amplifier receiving a clock at a positive input and an inverted clock at a negative input for buffering; a second differential amplifier receiving the clock at a negative input and the inverted clock at a positive input for buffering; a delay circuit receiving the outputs of the first and second differential amplifiers for delaying in time the clock by a skew to be compensated; a measurement delay line for adjusting time delay of the output of the delay circuit in a first direction; a phase comparator receiving the outputs of the measurement delay line and the first differential amplifier for applying the clock by the adjusted time delay; a variation delay line receiving the output of the phase comparator and the output of the first differential amplifier for adjusting the time delay in a second direction; a duplicate delay line receiving the output of the variation delay line and the output of the second differential amplifier for delaying in time the clock as adjusted by the measurement delay line; and an output buffer receiving the outputs of the variation delay line and the duplicate delay line to output a delay locked loop clock signal.

8 Claims, 9 Drawing Sheets

DELAY LOCKED LOOP OF A DDR SDRAM

FIELD OF THE INVENTION

The present invention relates to a semiconductor memory device, and, more particularly, to a delay locked loop of a semiconductor memory device.

BACKGROUND OF THE INVENTION

Major characteristics of a semiconductor memory are high speed, low power consumption and high integration. Recently, there has been a tendency to focus on high speed memory such as DDR (Double Data Rate) synchronous memory and RAMBUS DRAM from EDO (Extended Data Output) memory and synchronous memory. Recently, access times around 100 MHz have been accomplished by using a post charge logic and access times higher than that speed have been enabled by eliminating clock skew with a PLL (Phase Locked Loop) or a DLL (Delay Locked Loop). However, at a clock frequency higher than 200 MHz, an additional clock storage node, a bus line or a control logic is required, which results in enlarged chip size.

Efforts to realize a high speed semiconductor memory have resulted in the development of fast page EDO memory, synchronous memory, DDR synchronous memory and RAMBUS memory These memories are different from each other in speed, but all have inevitable limits.

Among the memories described above, the synchronous memory outputs data at a rising edge of a clock and inputs data at next rising edge of the clock. The period from the output strobe of data to the time at which data is outputted is tAC (Clock Access Time).

In 250 MHz operation, tAC is equal to tCK (Clock Cycle Time), which causes the DRAM controller to miss inputting data at the next clock pulse. That is, data cannot be read and written properly at speeds over 250 MHz.

FIG. 1 is a timing diagram of the tAC (Clock Access Time) and the clock skew. Referring to FIG. 1, the tAC consists of the clock skew and the data buffering time. The clock skew means the delay of an internal clock relative to an external clock. This delay is due to clock drivers. When the delay of an input buffer to which the external clock is applied is d1' and the delay of clock drivers serially coupled to the input buffer is d2, the clock skew is d1+d2. The phase locked loop (PLL) or delay locked loop is used to reduce that clock skew so as to realize a higher speed memory.

However, the phase locked loop or delay locked loop requires a number of cycles to lock which takes a length of time tLOCK (Locking time) and subsequently increases standby current.

FIGS. 2A–2B respectively provide a block diagram and a timing diagram of a PLL. Referring to FIG. 2A, the phase locked loop includes an input buffer 200 for buffering an external clock, a phase error detector 210 for detecting a phase difference between the external clock from the input buffer 200 and a fed-back clock signal from a delay monitoring circuit 240, a low pass filter 220 for eliminating high frequency components of the output of the phase error detector 210, a voltage controlled oscillator 230 for generating a clock signal which is proportional to the output of the low pass filter 220, the delay monitoring circuit 240 coupled to the output of the voltage controlled oscillator 230 for checking that the phase locked loop is locked normally, and a clock driver 250 for driving the output of the voltage controlled oscillator 230 as a clock output signal clkPLL.

To eliminate the clock skew by comparing the phase of the external clock with that of the internal clock, i.e., to have no phase error, hundreds of cycles are repeated for the tLOCK. Furthermore, in CMOS processing, it is difficult to design the voltage controlled oscillator 230 or the low pass filter 220. Parameters of the voltage controlled oscillator 230 and the low pass filter 220 have no operational voltage variation and no processing margin because of lower gain and noise requirements. To solve this problem, a synchronous delay line is introduced. Here, a synchronous mirror delay will be described. The synchronous mirror delay cannot be used for DDR synchronous memory because it operates by detecting the rising edge of the clock only.

FIGS. 3A and 3B respectively illustrate a block diagram and a timing diagram of a synchronous mirror delay. Referring to FIG. 3A, the synchronous mirror delay includes an input buffer 300 for buffering an external clock signal from an external clock, a delay monitoring circuit (DMC) 310 for delaying in time the output of the input buffer 300 by a skew to be compensated, a forward delay array (FDA) 320 for adjusting the time delay of output of the delay monitoring circuit 310 in a first direction, a mirror control circuit (MCC) 330 coupled to the outputs of the forward delay array 320 and the input buffer 300 for developing a clock signal adjusted by the adjusted time delay, a backward delay array (BDA) 340 for adjusting the time delay of the output of the mirror control circuit 330 in a second direction, an output circuit 350 coupled to the output of the backward delay array 340 for outputting a delay locked loop clock signal (CLKsmd).

An internal clock can be synchronized with the external clock in 2 clocks, but a unit delay restricts a jitter. The length of a delay chain should be increased to reduce this, which leads to increased area. As compared to the number of clocks required by the DLL that is implemented by a feed-back circuit, the synchronous mirror delay (SMD) reduces the clock skew by two sequential pulses tLOCK. The forward delay array 320 has an input and a number of outputs. The backward delay array 340 has a number of inputs and an output. Each of the forward delay array 320 and the backward delay array 340 has a delay unit, tDF (Forward Delay) and tDB (Backward Delay), respectively. The delay units are disposed in parallel and operated in opposite directions from each other. This is for simplicity and compactness of the circuit. The output of the forward delay array is coupled to the input of the backward delay array through the mirror control circuit 330.

FIG. 4 is a more detailed circuit diagram of a synchronous mirror delay. Referring to FIG. 4, the synchronous mirror delay includes an input buffer 300 for buffering an external clock, a delay circuit 310 for delaying in time the output of the input buffer 300, a forward delay array 320 receiving the time delayed clock pulse from the delay circuit 310, a mirror control circuit 330 receiving the outputs of the forward delay array 320 and the delay circuit 310, a backward delay array 340 receiving the outputs of the mirror control circuit 330, and an output circuit 350 for receiving the output of the backward delay array 340 to generate the output signal (Int.CLK).

In particular, a first stage of the forward delay array 320 includes a NAND gate 321 receiving the output of the delay circuit 310 and a power voltage. It also includes an inverter 322 receiving the output of the NAND gate 321. A second stage includes (a) a NAND gate 323 which receives the output of the inverter 322 and the power voltage, and (b) an inverter 324 which receives the output of the NAND gate 323. A third stage includes a NAND gate 325 which receives the output of the inverter 324 and an output of the mirror control circuit 330. It also includes an inverter 326 which receives the output of the NAND gate 325. A number of other stages coupled serially with and constructed similarly to the third stage are also included.

The mirror control circuit 330 includes a number of NAND gates. The output of the inverter of each stage of the forward delay array 320 and the output of the delay circuit 310 is coupled to a respective one of each of the NAND gates.

The backward delay array 340 includes a series of stages comprising a NAND gate and an inverter. An output of a stage of the mirror control circuit 330 and the output of the inverter of the previous stage of the mirror control circuit 330 is input to the NAND gates as shown in FIG. 4.

The output circuit 350 includes an even number of inverters receiving the output of the final stage of the backward delay array 340.

A delay element is constructed by a NAND gate and an inverter. The backward delay array 340 is designed to be a mirror image of the forward delay array 320 so as to independently match the delay on processing condition or voltage variation of the forward delay array 320.

Undergoing repeated tDF time delay, the clock passing the forward delay array 320 is to be delayed by a clock period. Since the clock signal delayed by the forward delay array 320 and the external clock are in phase at that time N which satisfies td+NtDF=tCLK, N can be found. Therefore, all the stages to its N-th stage of the delay array is activated and these activation signals are transferred to the backward delay array 340. If tDF (forward delay)=tDB (backward delay), only stages to the N-th stage in the backward delay array 340 are operated by values of the forward delay array 320 and total delay of the backward delay array 340 becomes tCK−td. When the delay of the input buffer 300 is d1 and the delay of the output circuit 350 is d2, total delay of the external clock can be expressed as follows:

$$d1+tCLK+(tCLK-d1-d2)+d2=2CLK \qquad \text{Eq.(1)}$$

In such a synchronous mirror delay, a unit delay is a jitter.

As described above, because the conventional delay locked loop operates only at the rising edge of the clock, they cannot be applied to DDR synchronous memory.

SUMMARY OF THE INVENTION

In accordance with an aspect of the present invention, there is provided a delay locked loop for use in a semiconductor memory device comprising: a first differential amplifier receiving a clock signal at a positive input and an inverted clock signal at a negative input for buffering; a second differential amplifier receiving the clock signal at a negative input and the inverted clock signal at a positive input; a delaying circuit receiving an output of each of the first and second differential amplifiers for delaying in time the clock signal by a skew to be compensated; a measurement delay line for adjusting a time delay of an output of the delaying circuit in a first direction; a phase comparator receiving outputs of the measurement delay line and the first differential amplifier; a variation delay line receiving outputs of the phase comparator and the first differential amplifier for adjusting the time delay in a second direction so as to detect a rising edge of the clock signal; a duplicate delay line receiving outputs of the variation delay line and the second differential amplifier so as to detect a falling edge of the clock signal; and an output buffer receiving outputs of the variation delay line and the duplicate delay line to output a delay locked loop clock signal which is substantially in phase with the clock signal.

BRIEF DESCRIPTION OF THE DRAWINGS

The following description of preferred examples is made in conjunction with the accompanying drawings, in which.

DETAILED DESCRIPTION OF EXEMPLARY APPARATUS.

Figure 1:
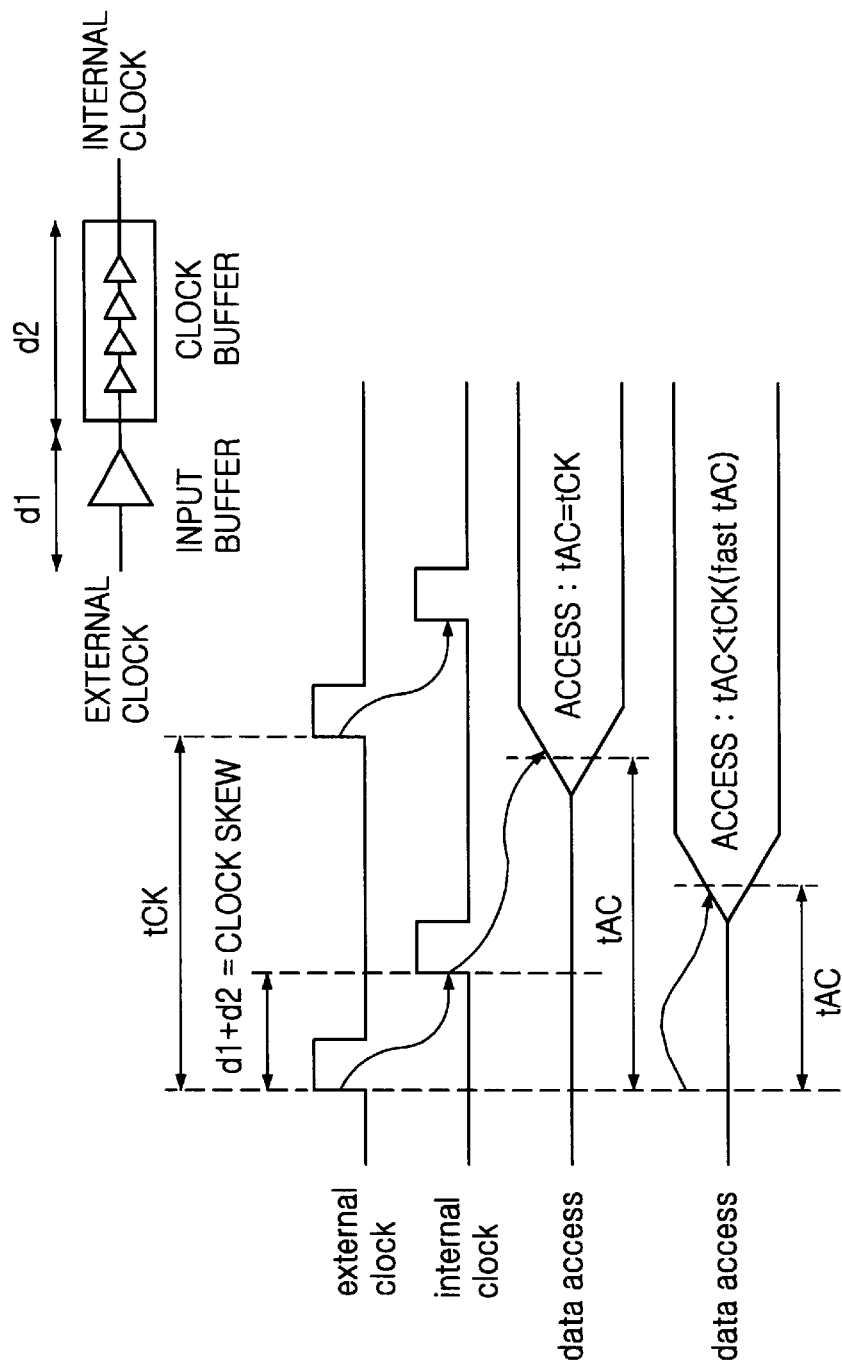
FIG. 1 is a timing diagram of tAC (Clock Access Time) and clock skew.
Figure 2A:
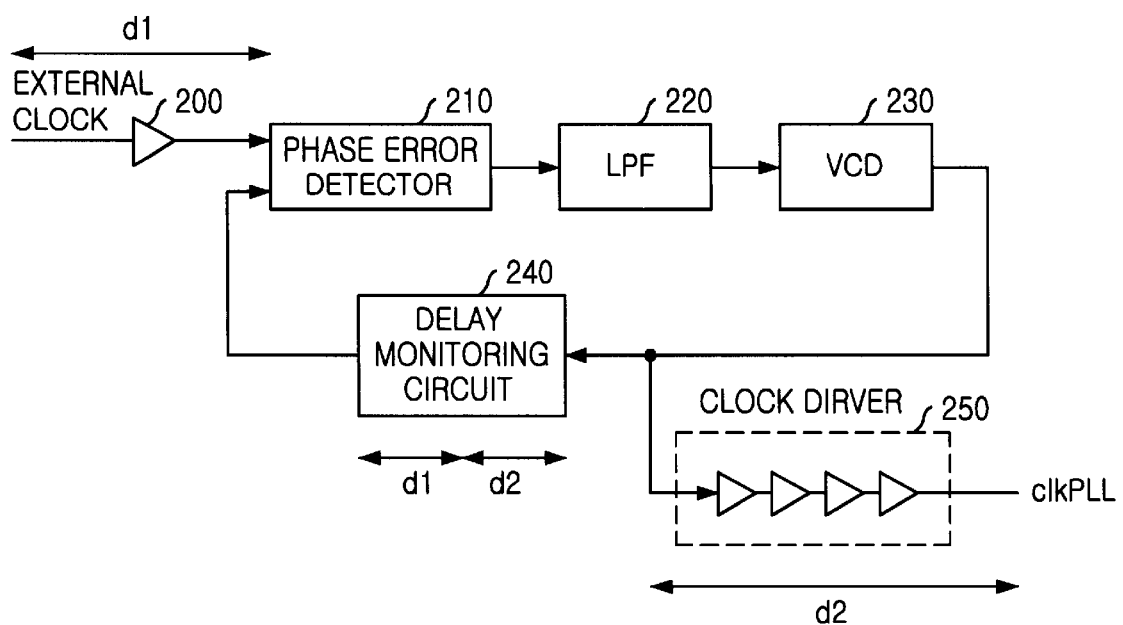
FIGS. 2A and 2B respectively provide a block diagram and a timing diagram of a phase locked loop.
Figure 2B:
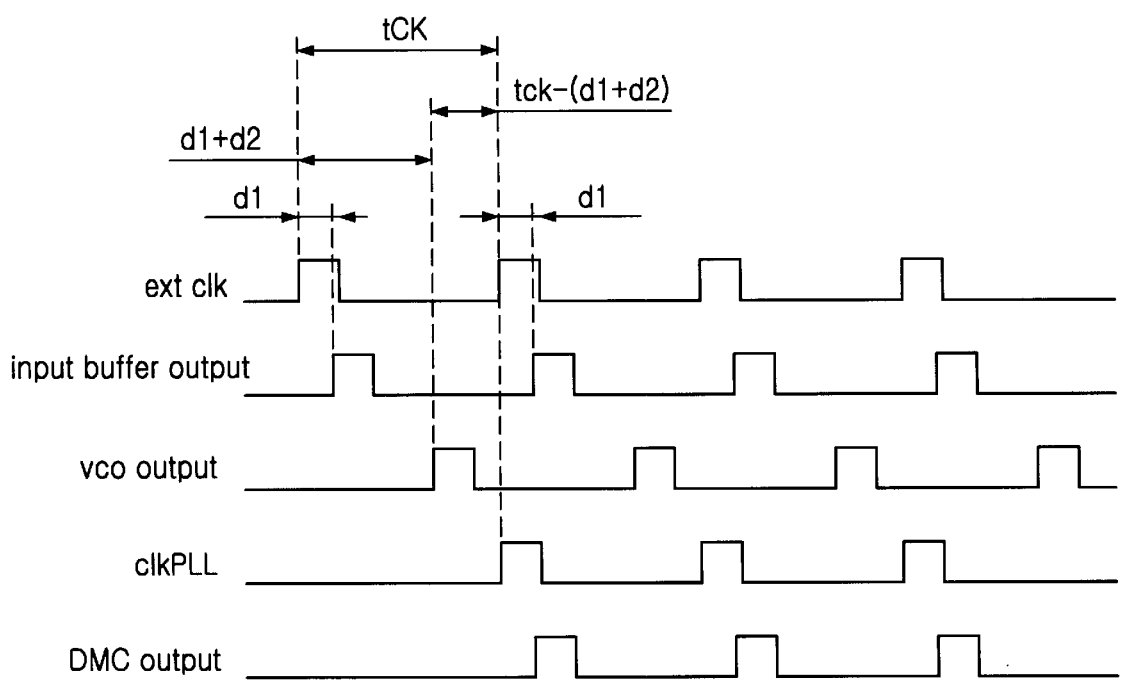
Figure 3A:
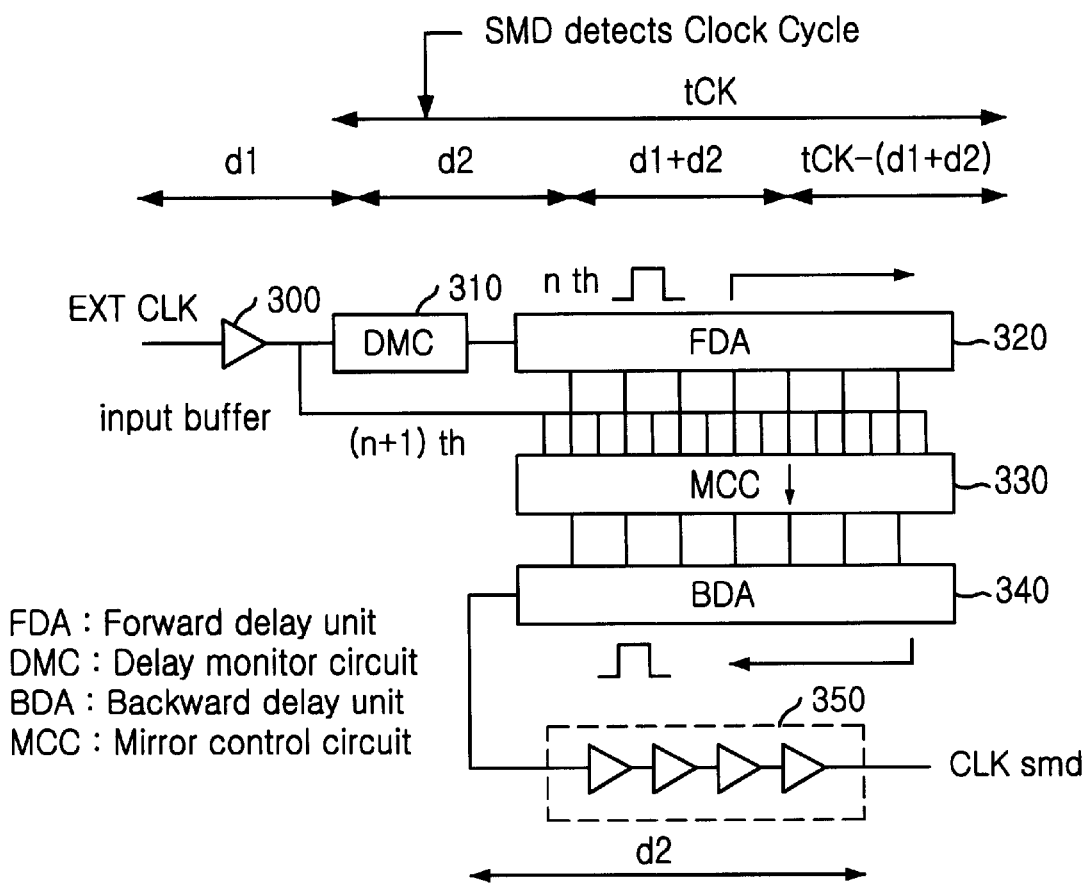
FIGS. 3A and 3B respectively provide a block diagram and a timing diagram of a synchronous mirror delay.
Figure 3B:
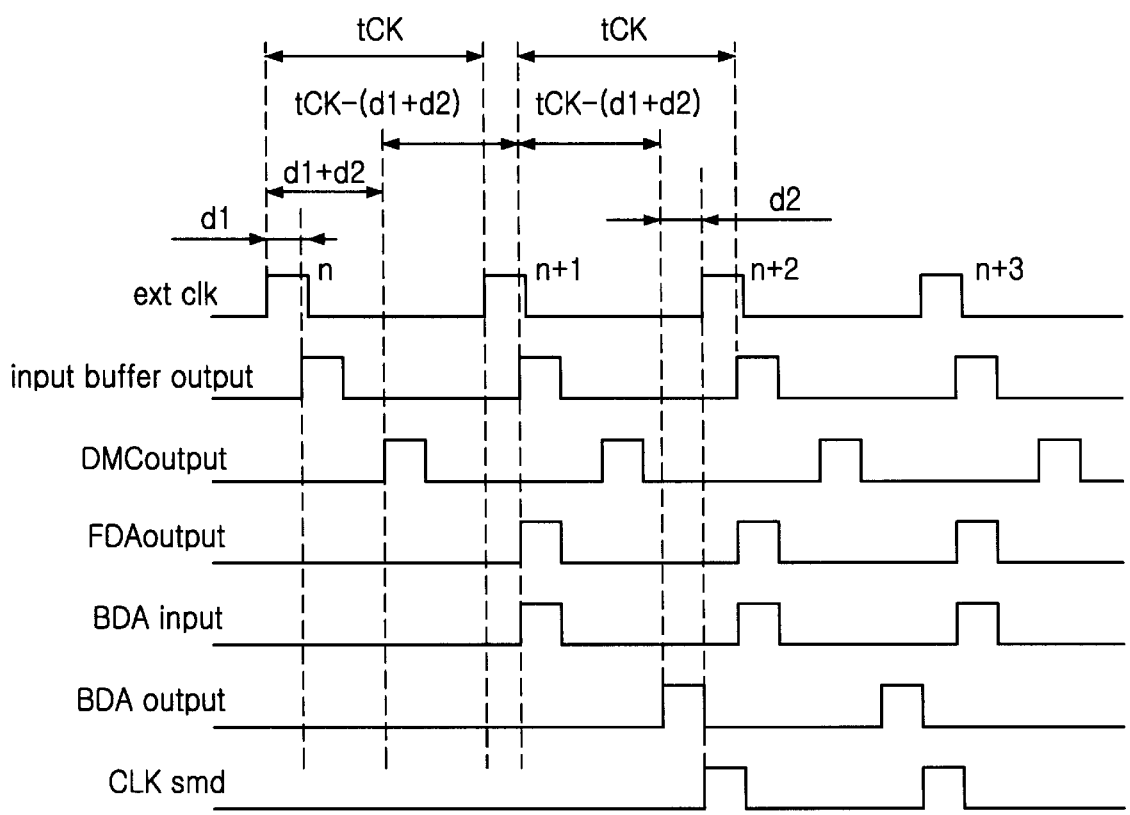
Figure 4:
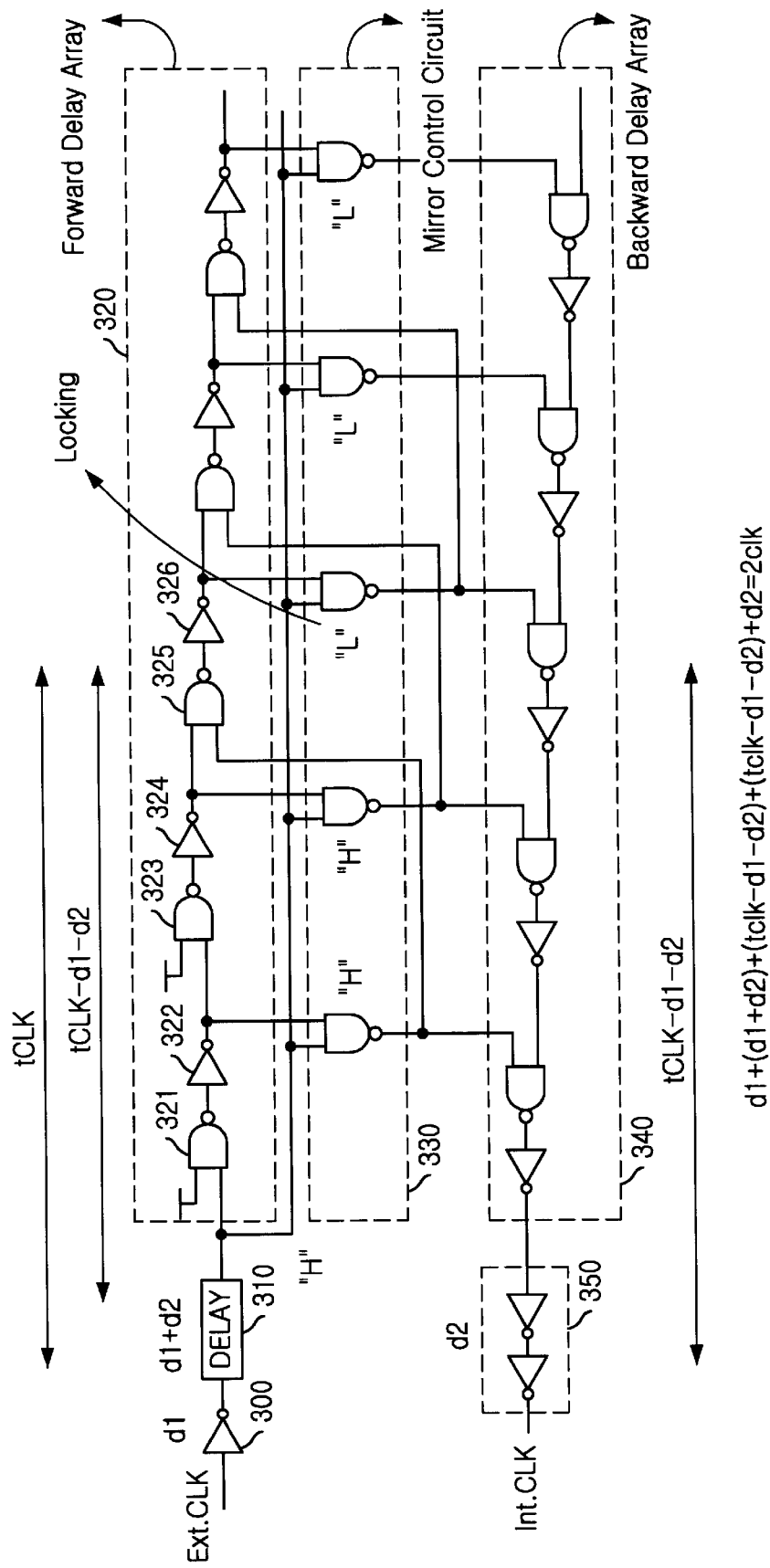
FIG. 4 provides a circuit diagram of a synchronous mirror delay.
Figure 5:
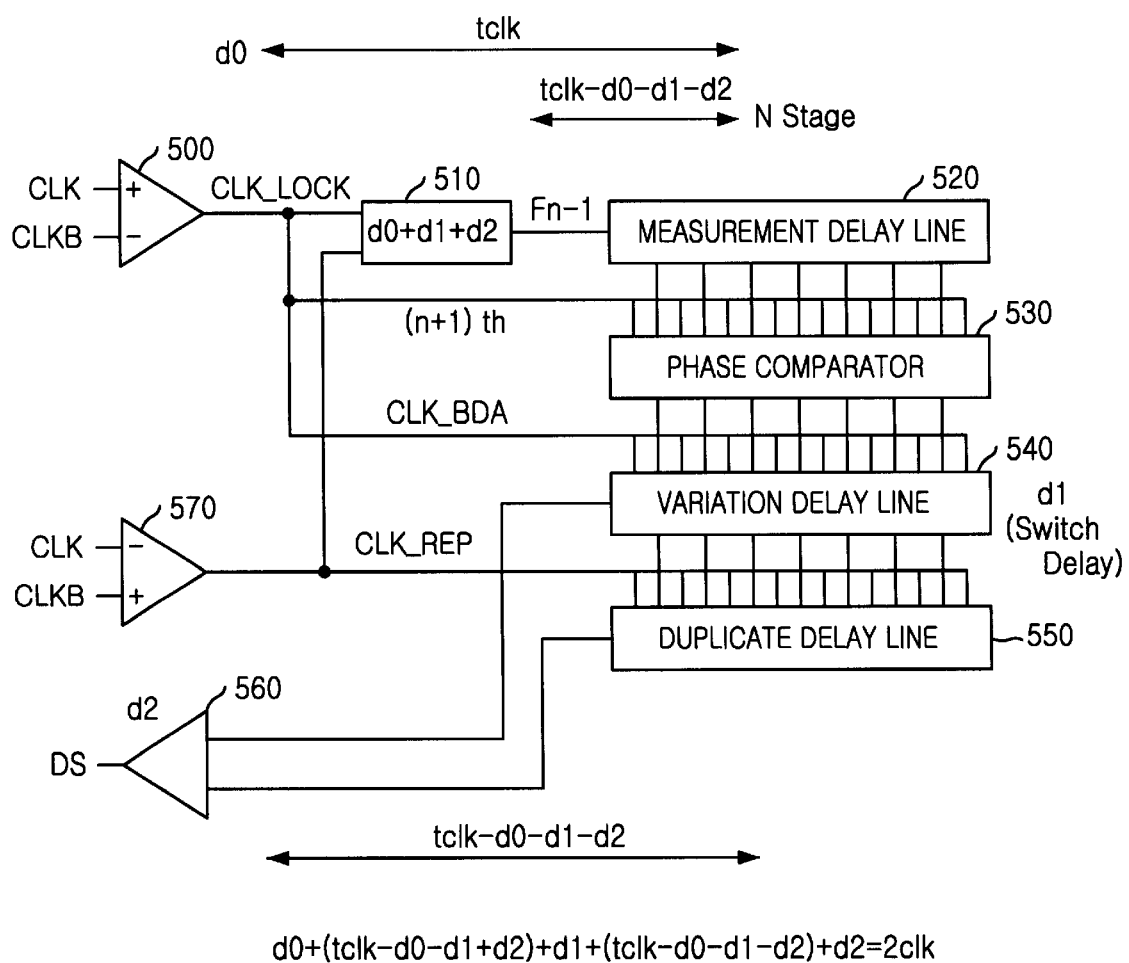
FIG. 5 is a block diagram of an exemplary delay locked loop constructed in accordance with the teachings of the invention and having a delay circuit synchronized with a clock.

FIG. 5 is a block diagram of a preferred delay locked loop having a delay circuit synchronized with a clock. Referring to FIG. 5, the delay locked loop comprises a first differential amplifier 500 receiving a clock (CLK) at a positive input and an inverted clock (CLKB) at a negative input for buffering. It also includes a second differential amplifier 570 receiving and buffering the clock (CLK) at a negative input and the inverted clock (CLKB) at a positive input for buffering. The circuit of FIG. 5 further includes a delay circuit 510 receiving the outputs of the first and second differential amplifiers for delaying in time the clock by a skew to be compensated, a measurement delay line 520 for adjusting time delay of the output of the delaying circuit 510 in a first direction, a phase comparator 530 receiving the outputs of the measurement delay line 520 and the first differential amplifier 500 for applying the clock by the adjusted time delay; a variation delay line 540 receiving the output of the phase comparator 530 and the output of the first differential amplifier 500 for adjusting the time delay in a second direction, a duplicate delay line 550 receiving the output of the variation delay line 540 and the output of the second differential amplifier 570 for delaying in time the clock as adjusted by the measurement delay line 520, and an output buffer 560 receiving the outputs of the variation delay line 540 and the duplicate delay line 550 to output a delay locked loop clock signal.

The duplicate delay line 550 is constructed to have the same processing and design condition as the measurement delay line 520. It detects a falling clock opposite to a rising clock by inverting the polarity of the input of the input buffer 500 via buffer 570. A first pulse of the clock signal passes through a fixed delay of the input buffer 500 and the measurement delay line 520 having a delay tCK (a cycle of the clock)−(d0+d1+d2). The delay tCK−(d0+d1+d2) determines the delay length of the variation delay line 540. A second pulse passes through the variation delay line 540 to the output buffer 560. Therefore, total delay is d0+(d0+d1+d2)+d1+[tCK−(d0+d1+d2)]+d2 =2tCK. In other words, the clock skew is eliminated in 2 clocks. Because the duplicate delay line 550 delays the falling edge of the clock by [tCK−(d0+d1+d2)], the falling edge of the clock is locked. The minimum locking frequency of the delay locked loop is determined by a sum of delays of the delay circuit 510 and the measurement delay line 520.

Figure 6:
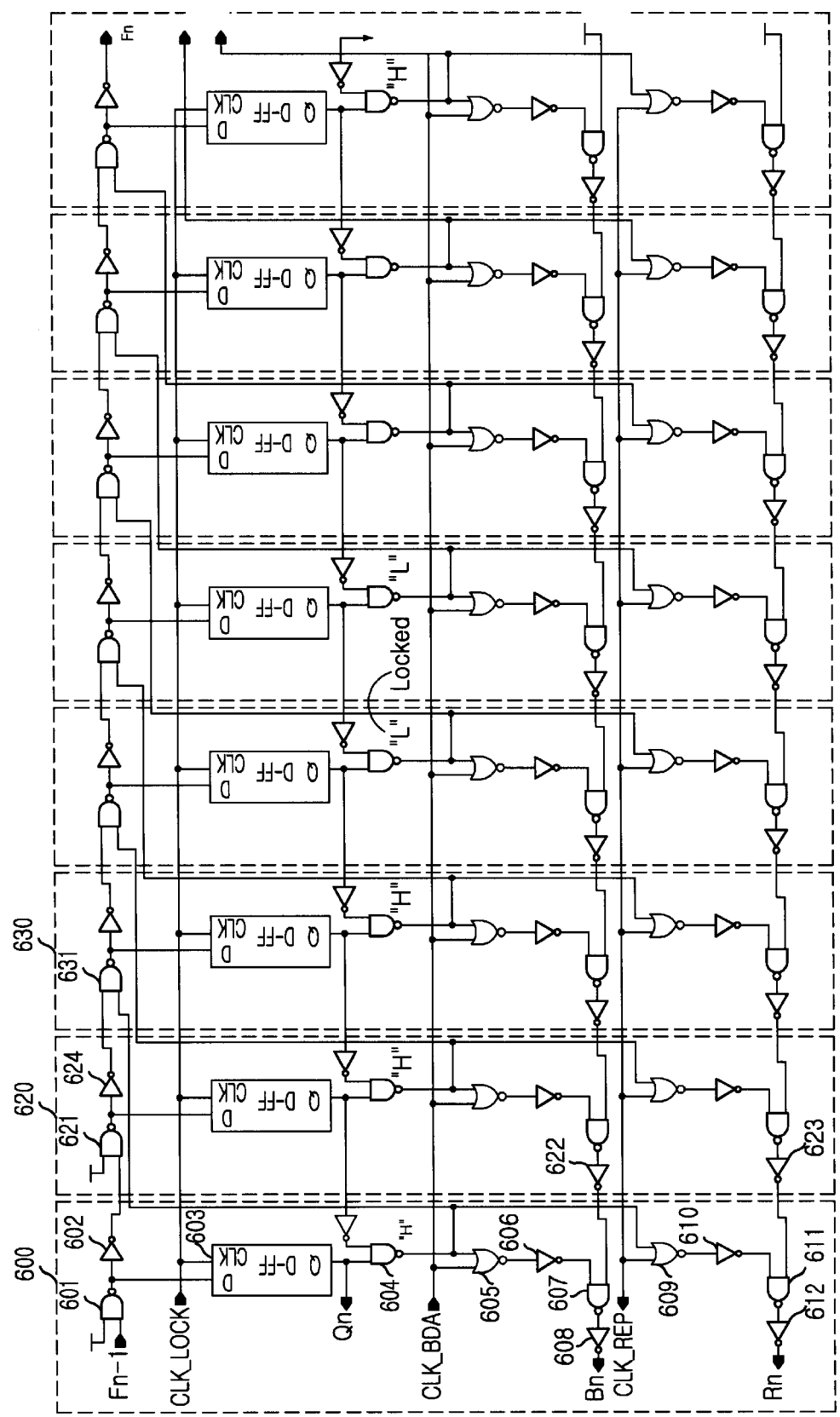
FIG. 6 provides a detailed circuit diagram of the delay array of the delay locked loop of FIG. 5.

FIG. 6 provides a detailed circuit diagram of the delay array of the delay locked loop. Referring to FIG. 6, the illustrated delay array includes a plurality of stages. The first stage 600 includes a NAND gate 601 receiving the power voltage and the output of the delay circuit 510, an inverter 602 receiving the output of the NAND gate 601, a D-flip flop 603 receiving the outputs of the NAND gate 601 and the first differential amplifier 500, a NAND gate 604 receiving the inverted outputs of the D-flip flop 603 and a NAND gate 621 of a next stage, a NOR gate 605 receiving the outputs of the NAND gate 604 and the first differential amplifier 500, an inverter 606 receiving the output of the NOR gate 605, a NAND gate 607 receiving the outputs of the inverter 606 and an inverter 622 of the next stage 620, an inverter 608 receiving the output of the NAND gate 607 to output to a NAND gate of a previous stage, a NOR gate 609 receiving the outputs of the second differential amplifier 570 and the NAND gate 604, an inverter 610 receiving the output of the NOR gate 609, a NAND gate 611 receiving the outputs of the inverter 610 and an inverter 623 of the next stage 620, and an inverter 612 receiving the output of the NAND gate 611.

A second stage 620 is identical to the first stage 600. A third stage 640 is similar to the first stage 600 except that a NAND gate 631 receives an output of an inverter 624 of the second stage 620 and the output of the NAND gate 604 of the first stage 600. The remaining stages are similar to the third stage 640 as shown in FIG. 6.

The delay array of FIG. 6 includes: (1) a measurement delay line 520 having a two-input NAND gate 601 and an inverter 602; (2) a phase comparator 530 having a D-flip flop 603; (3) a variation delay line 540 of a locked delay array; and (4) a two-input NOR gate 609 and an inverter 610 for switching a first input clock (CLK_DEL) and an inverted first input clock (CLKB_DEL) from the duplicate delay line to a second direction. The delay of the switching NOR gate 609 and inverter 610 is d1.

The phase comparator 530 compares the output of the N-th stage of the delay line of the phase comparator with the output of the N+1-th stage at the first input clock (CLK_DEL) and outputs logic low if the output of the N-th stage is logic high and the output of the N+1-th stage is logic low, which means phase locking. In FIG. 6, locked portion is shown. Because the signal need not be transferred to stages after this stage, the stages after this stage are deactivated.

The D-flip flop 603 is triggered at a positive edge and is used in the phase comparator 530 of the delay array. The capacitance within the variation delay line 540 and the duplicate delay line 550 are made equal by modeling the D-flip flops 603.

Figure 7:
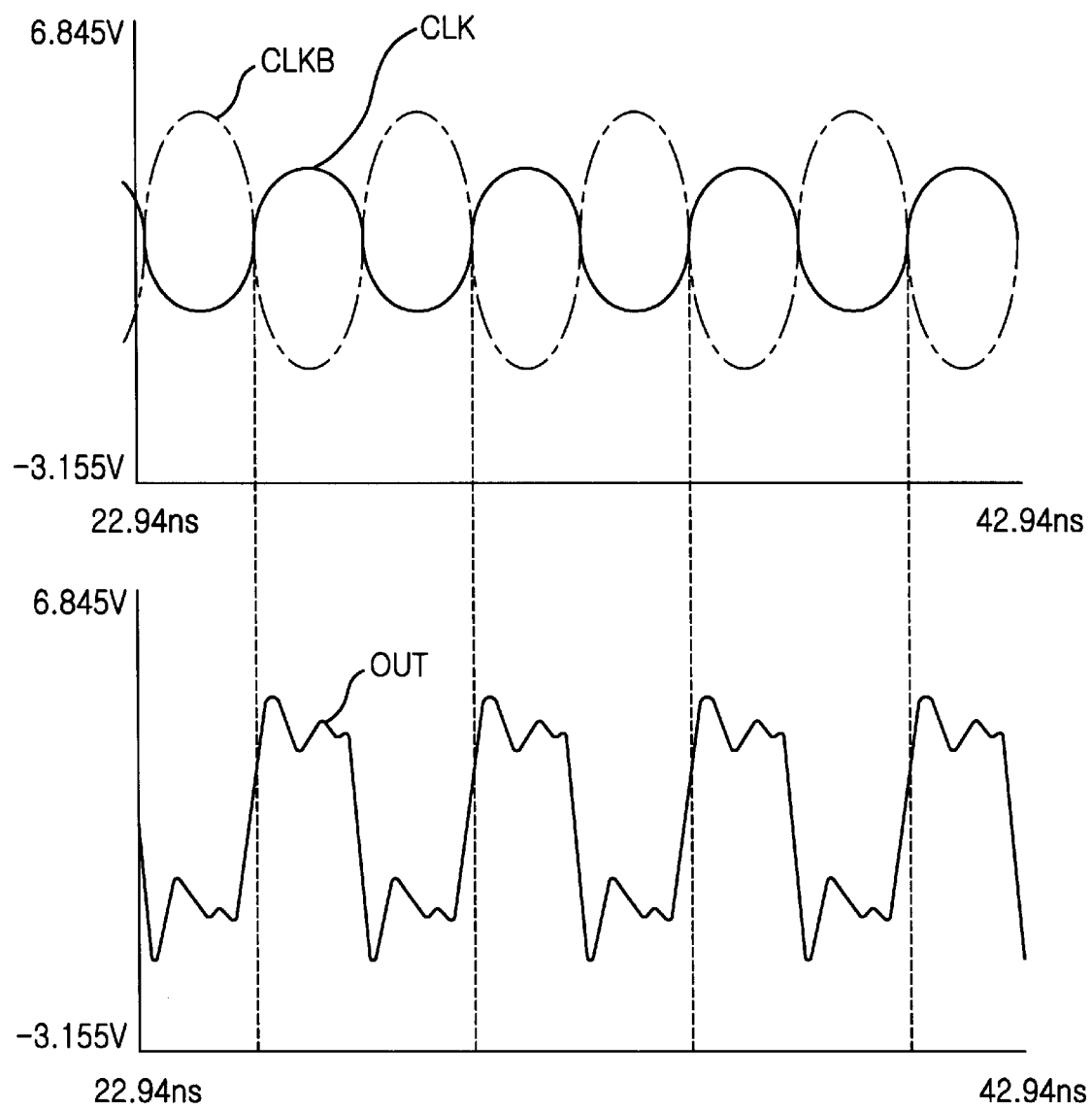
FIG. 7 shows an exemplary timing diagram of a measured voltage signal of an actual chip constructed in accordance with the teachings of the invention and manufactured by 0.6 micro CMOS processing.

FIG. 7 shows an exemplary timing diagram of a measured voltage signal of an actual chip manufactured by 0.6 micro CMOS processing. Referring to FIG. 7, at 200 MHz clock frequency, output can be provided without the clock skew as the clock (CLK) and the inverted clock (CLKB) are applied.

As described above, the disclosed delay locked loop is made applicable to DDR synchronous memory by using the duplicate delay line 550 controlled by the clock and the inverted clock so as to detect the delay locked loop clock at both the rising edge and the falling edge of the clock.

While the teachings of the invention have been explained with respect to particular examples, it will be apparent to those or ordinary skill in the art that the scope of this patent is not limited to those examples. On the contrary, this patent covers all apparatus falling within the spirit and scope of the appended claims.

What is claimed is:

1. A delay locked loop for use in a semiconductor memory device, the delay locked loop comprising:
    a first differential amplifier receiving a clock signal at a positive input and an inverted clock signal at a negative input;
    a second differential amplifier receiving the clock signal at a negative input and the inverted clock signal at a positive input;
    a delaying circuit receiving an output of each of the first and second differential amplifiers for delaying in time the clock signal by a skew to be compensated;
    a measurement delay line for adjusting a time delay of an output of the delaying circuit in a first direction;
    a phase comparator receiving outputs of the measurement delay line and the first differential amplifier;
    a variation delay line receiving outputs of the phase comparator and the first differential amplifier for adjusting the time delay in a second direction so as to detect a rising edge of the clock signal;
    a duplicate delay line receiving outputs of the variation delay line and the second differential amplifier so as to detect a falling edge of the clock signal; and
    an output buffer receiving outputs of the variation delay line and the duplicate delay line to output a delay locked loop clock signal which is substantially in phase with the clock signal.

2. The delay locked loop as recited in claim 1, wherein the measurement delay line includes a first stage having: (a) a first NAND gate receiving the output of the delaying circuit and a power voltage; and (b) a first inverter receiving an output of the first NAND gate.

3. The delay locked loop as recited in claim 2, wherein the measurement delay line includes a second stage having: (a) a second NAND gate receiving the output of the first inverter and the power voltage; and (b) a second inverter receiving the output of the second NAND gate.

4. The delay locked loop as recited in claim 2, wherein the phase comparator includes a first stage having: (a) a D-flipflop receiving the output of the first NAND gate and the output of the first differential amplifier; and (b) a third NAND gate receiving the output of the D-flipflop and an inverted output of a next stage.

5. The delay locked loop as recited in claim 3, wherein the phase comparator includes a first stage having: (a) a D-flipflop receiving the output of the first NAND gate and the output of the first differential amplifier; and (b) a third NAND gate receiving the output of the D-flipflop and an inverted output of a next stage.

6. The delay locked loop as recited in claim 5, wherein the measurement delay line includes a third stage having: (a) a fourth NAND gate receiving the output of the second inverter and the output of the third NAND gate; and (b) a third inverter receiving the output of the fourth NAND gate.

7. The delay locked loop as recited in claim 4, wherein the variation delay line includes a first stage having: (a) a first NOR gate receiving the output of the third NAND gate and the output of the first differential amplifier; (b) a third inverter receiving the output of the first NOR gate; (c) a fifth NAND gate receiving the output of the third inverter and the output of the variation delay line; and (d) a fourth inverter receiving the output of the fifth NAND gate.

8. The delay locked loop as recited in claim 4, wherein the duplicate delay line includes a first stage having: (a) a second NOR gate receiving the output of the second differential amplifier and the output of the third NAND gate; (b) a fifth inverter receiving the output of the second NOR gate; (c) a sixth NAND gate receiving the output of the fifth inverter and output of the duplicate delay line; and (d) an inverter receiving an output of the sixth NAND gate.

* * * * *